(12) United States Patent
Brandl

(10) Patent No.: US 7,460,345 B2
(45) Date of Patent: Dec. 2, 2008

(54) DATA CARRIER COMPRISING AN INTEGRATED CIRCUIT WITH AN ESD PROTECTION CIRCUIT

(75) Inventor: Roland Brandl, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/517,327

(22) PCT Filed: May 16, 2003

(86) PCT No.: PCT/IB03/02104

§ 371 (c)(1),
(2), (4) Date: Dec. 9, 2004

(87) PCT Pub. No.: WO03/105227

PCT Pub. Date: Dec. 18, 2003

(65) Prior Publication Data

US 2005/0231863 A1      Oct. 20, 2005

(30) Foreign Application Priority Data

Jun. 11, 2002   (EP) ................................ 02100694

(51) Int. Cl.
*H02H 9/00*    (2006.01)
*H02H 3/22*    (2006.01)
*H02H 1/00*    (2006.01)
*H02H 1/04*    (2006.01)
*H02H 9/06*    (2006.01)
*H01C 7/12*    (2006.01)

(52) U.S. Cl. .......................... 361/56; 361/111; 361/118
(58) Field of Classification Search ................... 361/56, 361/111, 118
See application file for complete search history.

(56) References Cited

U.S. PATENT DOCUMENTS

| | | | | | |
|---|---|---|---|---|---|
| 5,493,133 | A | * | 2/1996 | Duvvury et al. | 257/111 |
| 5,550,728 | A | * | 8/1996 | Ellis | 363/60 |
| 5,770,886 | A | * | 6/1998 | Rao et al. | 257/533 |
| 6,570,490 | B1 | * | 5/2003 | Saitoh et al. | 340/10.1 |
| 6,593,597 | B2 | * | 7/2003 | Sheu | 257/94 |

* cited by examiner

*Primary Examiner*—Michael J Sherry
*Assistant Examiner*—Dharti H Patel

(57) ABSTRACT

In the case of a data carrier (1) or an integrated circuit (5) for the data carrier (1), an ESD protection circuit (8) is formed by means of a series connection (9) comprising a first protection diode (10) and a protection stage (11) together with a second protection diode connected in parallel with the series connection (9), and a rectifier circuit (13) connected with the ESD protection circuit (8) is provided, which comprises a rectifier diode connected in parallel with the ESD protection circuit (8), wherein the rectifier diode takes the form of a Schottky diode (21) with a parasitic p/n junction (26) and wherein the Schottky diode (21) with the parasitic p/n junction (26) forms the second protection diode of the ESD protection circuit (8).

8 Claims, 1 Drawing Sheet

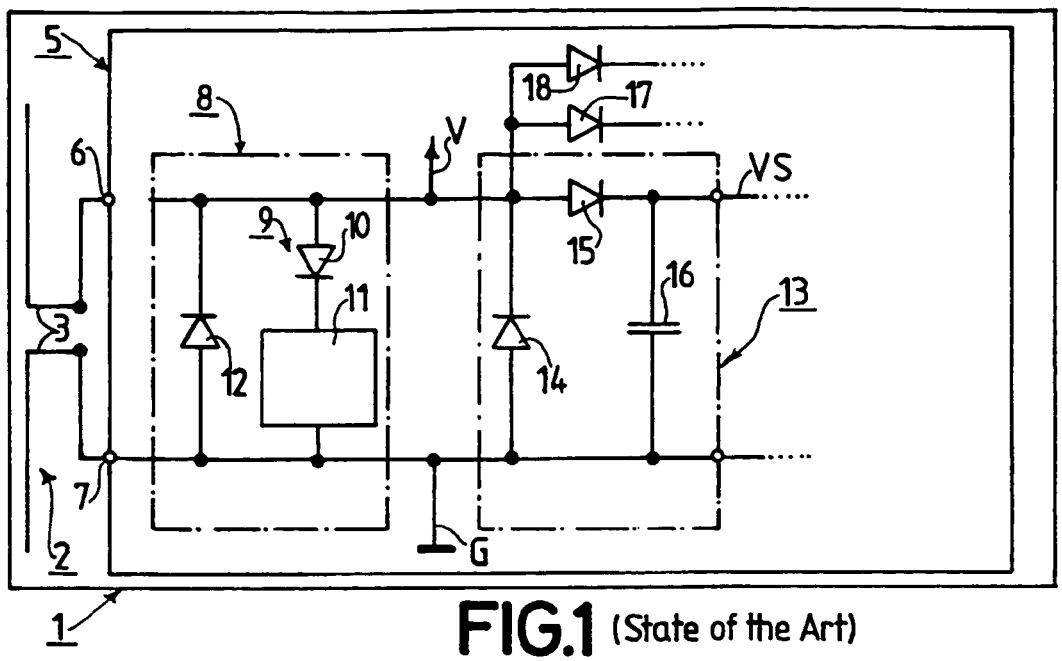
FIG.1 (State of the Art)
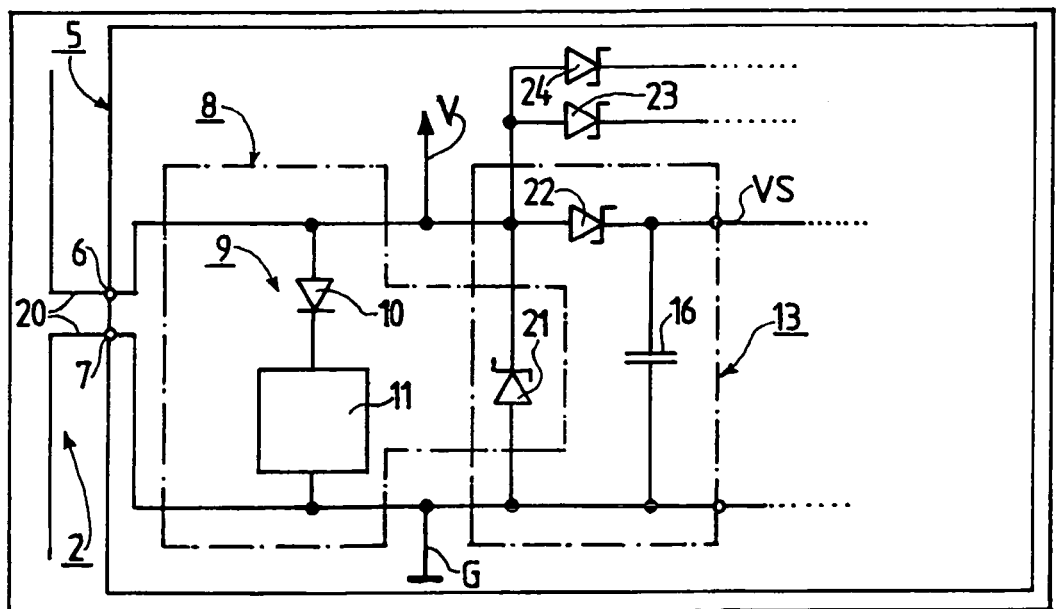
FIG.2
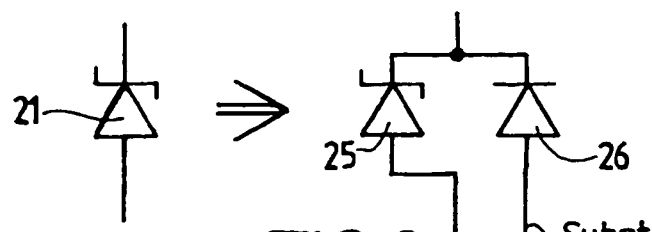
FIG.3

DATA CARRIER COMPRISING AN INTEGRATED CIRCUIT WITH AN ESD PROTECTION CIRCUIT

The invention relates to an integrated circuit for a data carrier, which integrated circuit comprises the following means: a first terminal and a second terminal, wherein the two terminals are provided for connection with transmission means of the data carrier, and an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and a rectifier circuit, which is connected to the ESD protection circuit and comprises a rectifier diode connected in parallel with the ESD protection circuit.

The invention also relates to a data carrier for contactless communication with a communications station, which data carrier comprises transmission means and an integrated circuit connected with the transmission means, which integrated circuit comprises the following means: a first terminal and a second terminal, wherein the two terminals are connected with the transmission means, and an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and a rectifier circuit, which is connected to the ESD protection circuit and comprises a rectifier diode connected in parallel with the ESD protection circuit.

Integrated circuits of the type described above in the first paragraph were developed by the applicant for use in data carriers and are known. In the known solutions, the two protection diodes of the ESD protection circuit each take the form of simple diodes, i.e. of a p/n junction, wherein the two protection diodes exhibit high current-carrying capacity, since they have to withstand loading with a current of approximately 1.2 amperes in the event of an "ESD voltage pulse" (electrostatic discharge pulse) according to the "Human Body Model (HBM)" of for example 2000 Volts. For implementation in an integrated circuit, such diodes require a relatively large amount of space, which is unfavorable. In addition, such diodes make a relatively large contribution to the input capacitance between the two terminals, which is particularly disadvantageous in the case of integrated circuits for data carriers which communicate in the MHz range or GHz range because a high input capacitance has a disadvantageous effect on the range of such a so-called RFID data carrier.

It is an object of the invention to avoid the above-described situation and to provide an improved integrated circuit and an improved data carrier.

To achieve the above-mentioned object, features according to the invention are provided for an integrated circuit according to the invention, such that an integrated circuit according to the invention may be characterized as follows:

An integrated circuit for a data carrier, which integrated circuit comprises the following means: a first terminal and a second terminal, wherein the two terminals are provided for connection with transmission means of the data carrier, and an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and a rectifier circuit, which is connected to the ESD protection circuit and comprises a rectifier diode connected in parallel with the ESD protection circuit, wherein the rectifier diode of the rectifier circuit takes the form of a Schottky diode with a parasitic p/n junction and wherein the Schottky diode with the parasitic p/n junction forms the second protection diode of the ESD protection circuit.

To achieve the above-mentioned object, features according to the invention are provided for a data carrier according to the invention, such that a data carrier according to the invention may be characterized as follows:

A data carrier for contactless communication with a communications station, which data carrier comprises transmission means and an integrated circuit connected with the transmission means, which integrated circuit comprises the following means: a first terminal and a second terminal, wherein the two terminals are connected with the transmission means, and an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and a rectifier circuit, which is connected to the ESD protection circuit and comprises a rectifier diode connected in parallel with the ESD protection circuit, wherein the rectifier diode of the rectifier circuit takes the form of a Schottky diode with a parasitic p/n junction and wherein the Schottky diode with the parasitic p/n junction forms the second protection diode of the ESD protection circuit.

By providing the features according to the invention it is possible to ensure, particularly simply and virtually without additional effort, that a rectifier diode which is necessary anyway for the rectifier circuit and here takes the form of a Schottky diode with a parasitic p/n junction is used at the same time as a protection diode for the ESD protection circuit, whereby one diode with a p/n junction may by omitted from the ESD protection circuit. This has the consequence of reducing markedly the input capacitance between the two terminals of the integrated circuit and of achieving a space saving when the ESD protection circuit is implemented in integrated technology.

In the solutions according to the invention, the rectifier circuit may take various forms, for example it may take the form of a voltage multiplier circuit. It has proven particularly advantageous for the rectifier circuit to take the form of a voltage doubler circuit, this being advantageous from the point of view of the simplest possible construction.

The above-stated aspects of the invention and further aspects thereof emerge from the example of embodiment described below and are explained with reference to this example of embodiment.

The invention will be further described with reference to examples of embodiments shown in the drawings, to which, however, the invention is not restricted.

FIG. 1 is a schematic representation of a part, essential in the present context, of a data carrier according to the prior art.

FIG. 2 shows, analogously to FIG. 1, a data carrier according to an example of embodiment of the invention.

FIG. 3 shows a rectifier diode of the data carrier according to FIG. 2.

FIG. 1 shows a known data carrier 1, which is provided and designed for contactless communication with a communications station, not shown. Such communication takes place on the basis of so-called RFID technology, wherein contactless data transmission takes place at a carrier frequency of for example 869 MHz.

The data carrier 1 here includes electromagnetically active transmission means 2, which comprise a dipole 3.

In addition, the data carrier 1 includes an integrated circuit 5, which comprises a first terminal 6 and a second terminal 7. The transmission means 2, i.e. the dipole 3, are connected with the two terminals 6 and 7. The two terminals 6 and 7 are thus provided for connection with the transmission means 2 of the data carrier 1.

The integrated circuit 5 of the known data carrier 1 includes an ESD protection circuit 8. The ESD protection circuit 8 is connected between the two terminals 6 and 7. The ESD protection circuit 8 includes a series connection 9 consisting of a first protection diode 10 and a protection stage 11. The protection stage 11 is so designed that the protection stage 11 may be brought from a blocking state into a conductive state by exceeding a voltage threshold fixed within the protection stage 11. Such protection stages 11 have long been known in specialist circles, for which reason the detailed circuit design is not examined more fully here. When the protection stage 11 is in the blocking state, it displays virtually infinite volume resistance, such that the first protection diode 10 is then connected without any effect. When the protection stage 11 is in the conductive state, it displays almost negligible volume resistance, whereby the first protection diode 10 is then connected for practical purposes with a reference potential G. The ESD protection circuit 8 further comprises a second protection diode 12, which is connected in parallel with the series connection 9 and which is connected in opposition to the first protection diode 10 of the series connection 9, as is clear from FIG. 1. Each of the two protection diodes 10 and 12 takes the form of a simple, conventional diode, i.e. a p/n junction. The two protection diodes 10 and 12 display a high current-carrying capacity. In each case, each of the two protection diodes 10 and 12 may be loaded briefly with a current with a current intensity of approximately 5.0 amperes, without damage or impairment of operation.

The integrated circuit 5 further comprises a rectifier circuit 13, which is connected with the ESD protection circuit 8, namely in parallel with the ESD protection circuit 8. In the present case, the rectifier circuit 13 takes the form of a voltage doubler circuit. The rectifier circuit 13 here comprises a first rectifier diode 14 connected in parallel with the ESD protection circuit 8 and a second rectifier diode 15, together with a storage capacitor 16 connected downstream of the two rectifier diodes 14 and 15. In the case of operation of the data carrier 1, an operating potential V is present at a first input of the rectifier circuit 13 and the reference potential G is present at a second input. By means of the rectifier circuit 13, a supply voltage VS may be generated upon operation of the data carrier 1, which voltage VS corresponds to twice the operating potential value V and which is output to all those components of the integrated circuit 5 which require this supply voltage VS.

A third rectifier diode 17 and a fourth rectifier diode 18 also cooperate with the first rectifier diode 14 of the rectifier circuit 13. A storage capacitor, not shown, is connected to each of the two further rectifier diodes 17 and 18. A demodulation circuit of the integrated circuit 5 is connected to the third rectifier diode 17 and a modulation circuit of the integrated circuit 5 is connected to the fourth rectifier diode 18, as has also long been known and conventional. The integrated circuit 5 comprises a series of circuit components not shown in FIG. 1, such as a clock signal generating stage, a microcomputer or, instead of the microcomputer, a hard-wired logic circuit and memory chips, which are not examined more fully here, however, because they are not important in the present context.

The four rectifier diodes 14, 15, 17 and 18 also each take the form of a conventional diode, i.e. a p/n junction.

FIG. 2 shows a data carrier 1 according to the invention. As far as the data carrier 1 according to FIG. 2 is concerned, reference is made below mainly to the differences from the known data carrier 1 according to FIG. 1.

The data carrier 1 according to FIG. 2 is provided and designed for communication at markedly higher carrier frequencies than the data carrier 1 according to FIG. 1. The data carrier 1 according to FIG. 2 is provided and designed for communication at a carrier frequency of around 2.45 GHz. However, the data carrier 1 according to FIG. 2 may also be provided and designed for communication at carrier frequencies of 869 MHz or at carrier frequencies in the range between 902 MHz and 930 MHz. A carrier frequency of approximately 5.8 GHz is also possible.

The data carrier 1 according to FIG. 2 comprises transmission means 2 designed to be suitable for such high carrier frequencies, which transmission means 2 in this case take the form of a dipole 20. The dipole 20 is connected with the two terminals 6 and 7 of the integrated circuit 5 of the data carrier 1 according to FIG. 2 and, like the dipole 3 of the data carrier 1 according to FIG. 1, does not here form a direct electrical connection between the two terminals 6 and 7. The data carrier 1 according to FIG. 2 also comprises an ESD protection circuit 8 and a rectifier circuit 13.

In this case, the rectifier circuit 13 is implemented by means of Schottky diodes, namely a first Schottky diode 21 and a second Schottky diode 22. The additional diodes 23 and 24 cooperating with the first Schottky diode 21 in this case also take the form of Schottky diodes. The special design feature of the Schottky diode 21 of the integrated circuit 5 of the data carrier 1 according to FIG. 2 is that this first Schottky diode 21, provided as first rectifier diode, takes the form of a pure Schottky diode 25 with a parasitic p/n junction 26, as may be inferred for the first Schottky diode 21 from FIG. 3. As is clear from FIG. 3, the first Schottky diode 21 consists of the pure Schottky diode 25 and the parasitic p/n junction 26 cooperating with the pure Schottky diode 25, which junction 26 is opposite the substrate, connected with the reference potential G, of the integrated circuit 5, which is indeed the very reason why it is a parasitic p/n junction. The parasitic p/n junction does not necessarily have to be opposite the substrate, however, but may be effected in some other way, lying parallel to the pure Schottky diode 25 for example.

The advantage of the first Schottky diode 21 comprising a parasitic p/n junction 26, i.e. of the first Schottky diode 21 consisting of a pure Schottky diode 25 and a parasitic p/n junction 26, consists in the fact that the pure Schottky diode 25 exhibits a relatively low conducting-state voltage and a relatively high forward d.c. resistance and that the parasitic p/n junction, which corresponds at least substantially to a normal diode, exhibits a relatively high conducting-state voltage and a relatively low forward d.c. resistance.

When the data carrier 1 or the integrated circuit 5 is constructed in accordance with FIG. 2, the first Schottky diode 21 with the parasitic p/n junction 26 simultaneously forms the second protection diode of the ESD protection circuit 8, such that all that is required in the ESD protection circuit 8 is the first protection diode 10 and the protection stage 11.

When the data carrier 1 is constructed in accordance with FIG. 2, therefore, one protection diode, i.e. a p/n junction, is omitted in the ESD protection circuit 8 relative to the known data carrier 1 according to FIG. 1, because the function of this protection diode is fulfilled by the first rectifier diode, i.e. by the first Schottky diode 21. This brings with it the considerable advantage that a current-carrying diode may be omitted, i.e. does not have to be provided, whereby a markedly reduced input capacitance is obtained between the two terminals 6 and 7 and whereby space is saved during the integration process.

In normal operation of the data carrier 1 according to FIG. 2, i.e. if a carrier signal is received by means of the dipole 20, the consequence is that an operating potential V of approximately 1.0 Volts and a supply voltage VS of approximately 2.0 Volts are achieved.

In normal operation of the data carrier 1 or the integrated circuit 5, the protection stage 11 is directed into its blocking state and the first protection diode 10 is consequently rendered inoperative. In addition, the pure Schottky diode 25 is the active, i.e. conductive part, of the first Schottky diode 21 due to the lower conducting-state voltage, whereas the parasitic p/n junction 26 remains inactive, i.e. non-conductive, due to the higher conducting-state voltage.

If an "ESD voltage pulse", i.e. a short-term overvoltage, occurs, a distinction may then be drawn between two situations. If a positive high ESD voltage pulse occurs at terminal 6, this results in the protection stage 11 being brought to breakdown, i.e. into its conductive state, whereupon the ESD current produced by the positive high ESD voltage pulse may then flow across the first protection diode 10 and consequently a protection function is ensured for the subsequent circuit components.

If a negative high ESD voltage pulse occurs at terminal 6, the parasitic p/n junction 26 is the active, i.e. conductive part, of the first Schottky diode 21 due to the lower forward d.c. resistance, whereas the pure Schottky diode 25 remains inactive, i.e. non-conductive, due to the higher forward d.c. resistance. The protection function is thus fulfilled in this case by the parasitic p/n junction 26.

By means of the first Schottky diode 21 and the protection diode 10 and the protection stage 11, therefore, problem-free protection of the remaining parts of the integrated circuit 5 and consequently of the data carrier 1 is ensured, wherein, however, the substantial advantage is obtained that only a small input capacitance is present between the two terminals 6 and 7, which is advantageous with regard to a largest possible range of the data carrier 1.

The invention claimed is:

1. An integrated circuit for a data carrier, comprising:
    a first terminal and a second terminal, wherein the two terminals are provided for connection with transmission means of the data carrier,
    an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and
    a rectifier circuit, which is connected to the ESD protection circuit and comprises a rectifier diode connected in parallel with the ESD protection circuit,
    wherein the rectifier diode of the rectifier circuit takes the form of a pure Schottky diode with a parasitic p/n junction and wherein the pure Schottky diode with the parasitic p/n junction simultaneously forms the second protection diode of the ESD protection circuit.

2. An integrated circuit as claimed in claim 1, wherein the rectifier circuit takes the form of a voltage doubler circuit.

3. A data carrier for contactless communication with a communications station, which data carrier comprises:
    transmission means and
    an integrated circuit connected with the transmission means, which integrated circuit comprises:
        a first terminal and a second terminal, wherein the two terminals are connected with the transmission means,
        an ESD protection circuit, which is connected between the two terminals and which comprises a series connection consisting of a first protection diode and a protection stage, which protection stage may be brought from a blocking state into a conductive state by exceeding a voltage threshold, and which comprises a second protection diode connected in parallel with the series connection and in opposition to the first protection diode of the series connection, and
        a rectifier circuit, which is connected to the ESD protection circuit and comprises a rectifier diode connected in parallel with the ESD protection circuit,
        wherein the rectifier diode of the rectifier circuit takes the form of a pure Schottky diode with a parasitic p/n junction and wherein the pure Schottky diode with the parasitic p/n junction simultaneously forms the second protection diode of the ESD protection circuit.

4. A data carrier as claimed in claim 3, wherein the rectifier circuit takes the form of a voltage doubler circuit.

5. An integrated circuit as claimed in claim 1, wherein the rectifier circuit further comprises a second rectifier diode that takes the form of a Schottky diode.

6. An integrated circuit as claimed in claim 5, wherein the rectifier circuit further comprises a third rectifier diode and a fourth rectifier diode, wherein the third and fourth rectifier diodes each take the form of a Schottky diode.

7. A data carrier as claimed in claim 3, wherein the rectifier circuit further comprises a second rectifier diode that takes the form of a Schottky diode.

8. A data carrier as claimed in claim 7, wherein the rectifier circuit further comprises a third rectifier diode and a fourth rectifier diode, wherein the third and fourth rectifier diodes each take the form of a Schottky diode.

* * * * *